(12) United States Patent
Groenhuis et al.

(10) Patent No.: US 9,418,918 B2
(45) Date of Patent: Aug. 16, 2016

(54) LEAD FOR CONNECTION TO A SEMICONDUCTOR DEVICE

(71) Applicant: NXP B.V., Eindhoven (NL)

(72) Inventors: Roelf Anco Jacob Groenhuis, Nlijmegen (NL); Tim Boettcher, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/667,979

(22) Filed: Mar. 25, 2015

(65) Prior Publication Data

US 2015/0287666 A1  Oct. 8, 2015

(30) Foreign Application Priority Data

Apr. 7, 2014 (EP) ..................... 14163714

(51) Int. Cl.
*H01L 23/495* (2006.01)
*H01L 23/00* (2006.01)

(52) U.S. Cl.
CPC .......... *H01L 23/49524* (2013.01); *H01L 24/37* (2013.01); *H01L 23/49562* (2013.01); *H01L 24/40* (2013.01); *H01L 24/84* (2013.01); *H01L 2224/352* (2013.01); *H01L 2224/37011* (2013.01); *H01L 2224/37013* (2013.01); *H01L 2224/37147* (2013.01); *H01L 2224/37611* (2013.01); *H01L 2224/37639* (2013.01); *H01L 2224/4007* (2013.01); *H01L 2224/40095* (2013.01); *H01L 2224/40245* (2013.01); *H01L 2224/40247* (2013.01); *H01L 2224/84801* (2013.01)

(58) Field of Classification Search
CPC .................... H01L 23/49575; H01L 23/49548
USPC ......................................... 257/676; 438/123
See application file for complete search history.

(56) References Cited

U.S. PATENT DOCUMENTS

| 2007/0290336 | A1 | 12/2007 | Sun et al. | |
|---|---|---|---|---|
| 2011/0227205 | A1* | 9/2011 | Lu et al. | 257/670 |
| 2012/0300491 | A1* | 11/2012 | Hussell et al. | 362/602 |
| 2014/0054758 | A1 | 2/2014 | Yilmaz et al. | |

FOREIGN PATENT DOCUMENTS

| CN | 101819955 A | 9/2010 |
|---|---|---|
| EP | 2 498 289 A2 | 9/2012 |
| JP | 2004-134445 A | 4/2004 |
| JP | 2006-190728 A | 7/2006 |
| JP | 2011-249395 A | 12/2011 |
| JP | 2013-161941 A | 8/2013 |

OTHER PUBLICATIONS

Extended European Search Report for EP Patent Appln. No. 14163714.0 (Jan. 13, 2015).

* cited by examiner

*Primary Examiner* — Theresa T Doan

(57) ABSTRACT

There is disclosed a lead for connection to a semiconductor device die, the lead comprising a clip portion. The clip portion comprises a major surface having two or more protrusions extending therefrom for connection to a bond pad of the semiconductor device die.

17 Claims, 5 Drawing Sheets

US 9,418,918 B2

LEAD FOR CONNECTION TO A SEMICONDUCTOR DEVICE

CROSS-REFERENCE TO RELATED APPLICATIONS

This application claims the priority under 35 U.S.C. §119 of European patent application no. 14163714.0, filed on Apr. 7, 2014, the contents of which are incorporated by reference herein.

FIELD

The invention relates to a lead for connection to a semiconductor device die and to semiconductor components comprising such leads.

BACKGROUND

Semiconductor components are typically formed of a semiconductor device die and one or more leads and wire bonds for making electrical connection from the lead to the device die via a metal contact on the device die. Wire bonding processes for high current devices are slow and difficult to test where several bonds are used in parallel. In addition wire bonds may result in unreliable contacts. Furthermore, the electrical performance of the semiconductor component may suffer from parasitic resistances and inductances caused by the wire bonds. In applications such as switch mode power supplies, electro-static discharge protection devices or transient voltage suppression devices, or other applications having large current variations, large voltage spikes may occur due to the inductances in the wire bond. In addition in high current applications (typically in the order of amps) device heating may cause the wire bonds to degrade.

As an alternative to wire bonds the leads may comprise a clip portion for bonding to the semiconductor device die. This arrangement is known as a clip bond and compared to wire bonds may result in improved electrical and thermal performance of the semiconductor component and more reliable contacts.

When clip bonding to a semiconductor die via a metal contact, a solder may be used to complete the electrical and mechanical connection. As is well known in the art, the solder may be in the form of a paste comprising a proportion of lead, tin and silver powder in addition to other additives such as flux medium. However, such an arrangement can suffer from a number of problems such as the device die and clip not aligning properly, which can result in short circuits, and a solder layer thickness which can result in voids within the solder paste. During soldering processes, such as reflow processes (which are known in the art) evaporating gasses cannot escape from the voids and may result movement of the die with respect to the clip, again causing misalignment. Such void may also reduce the mechanical and/or electrical integrity of the connection.

A known lead 1 comprising a clip portion 2 bonded to a semiconductor device die 3 is shown in FIGS. 1a and 1b. As shown, the clip portion 2 comprises a major surface 8 which may be directly adjacent the semiconductor die 3 when the lead 1 fixed to a semiconductor device die 3. The clip portion 2 includes a contact portion 9 which is arranged to be mechanically and electrically connected using an appropriate solder material to appropriate metal contacts (not illustrated) pre-formed on the semiconductor device die 3.

Including the disadvantages mentioned above the illustrated arrangement and other known arrangements may also suffer from the problem that the integrity of the solder connection between the semiconductor device die and the clip may only be inspected from the side which may result in slower production through-put. In large scale industrial process it is advantageous to inspect from above using, for example a microscope. In addition observations have found that the semiconductor device dies may not correctly align with the clip portion, which could result in short circuits on the semiconductor die, thus rendering the semiconductor component inoperable.

SUMMARY

According to an aspect of the invention there is provided lead for connection to a semiconductor device die, the lead comprising a clip portion, said clip portion comprising a major surface having two or more protrusions extending therefrom for connection to a bond pad of the semiconductor device die.

The invention also relates to semiconductor component comprising such a lead.

Yet further the invention relates to such a semiconductor component wherein the semiconductor component is a power rectifier device or a transient voltage suppression device.

Embodiments may relate to a semiconductor component which carry high currents such as in the range of 5 to 20 amps and have low forward voltage.

DESCRIPTION OF THE DRAWINGS

In the figures and description like reference numerals refer to like features. The invention is described further hereinafter by way of example only with reference to the accompanying drawings in which:

FIGS. 2a and 2b show bottom and side views respectively of an embodiment of lead 20 suitable for connection to a semiconductor device die 3. The lead 20 may comprise a clip portion 22 and a leadframe connection clip 24. The leadframe connection clip 24 is arranged such that it may connect to a leadframe clip pad 21 to allow electrical current to flow to or from external sources to the semiconductor device die 3 via the clip portion 22. The semiconductor device die 3 may be contacted mechanically and/or electrically to a leadframe die pad 23 using any appropriate connection, such as solder paste or conductive adhesive.

Figure 1A:
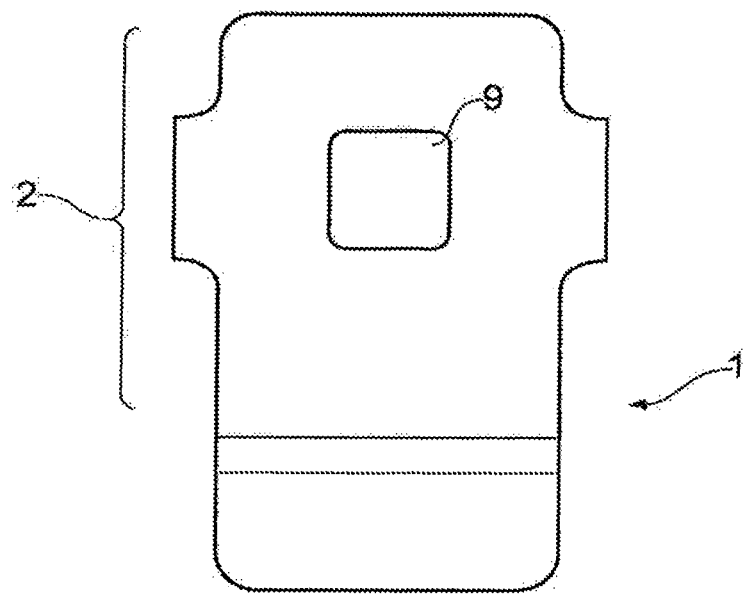
FIG. 1a shows a plan view of a known connection lead.
Figure 1B:
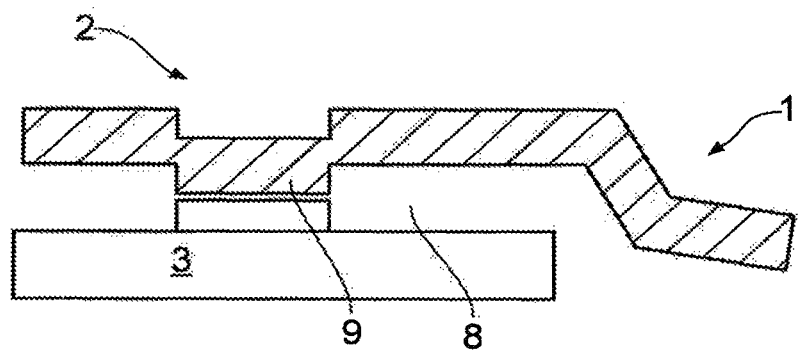
FIG. 1b shows a cross-sectional view of a known connection lead.

The clip portion 22 comprises a first major surface 28 and a second major surface 30. When the lead 20 is attached to a contact portion (also known as metallization) of the semiconductor device die 3 the first major surface 28 will be proximal to and substantially facing the semiconductor device die 3. A through hole 26 may be provided all the way through the clip portion 22 from the first major surface 28 to the second major surface 30.

The function of the through hole 26 is to act as ventilation and allow gasses to escape which may accumulate under first major surface 28 of the clip portion 22 during soldering process. During the soldering process gasses may build up and cause bubbles inside the solder material. After the soldering process these bubbles may result in result in the formation of voids under the clip portion 22 in the solder material as the solder cools. The voids may result in unstable solder joints, which may in turn result in misalignment of the semiconductor device die 3 with respect to the clip portion 22. Such misalignments may result in short circuits between contacts on the semiconductor device die 3 or no electrical connection to the semiconductor device die 3. By allowing gasses to escape, voids may be minimised or even prevented. Voiding may also result in poor electrical and thermal contact performance.

Figure 2A:
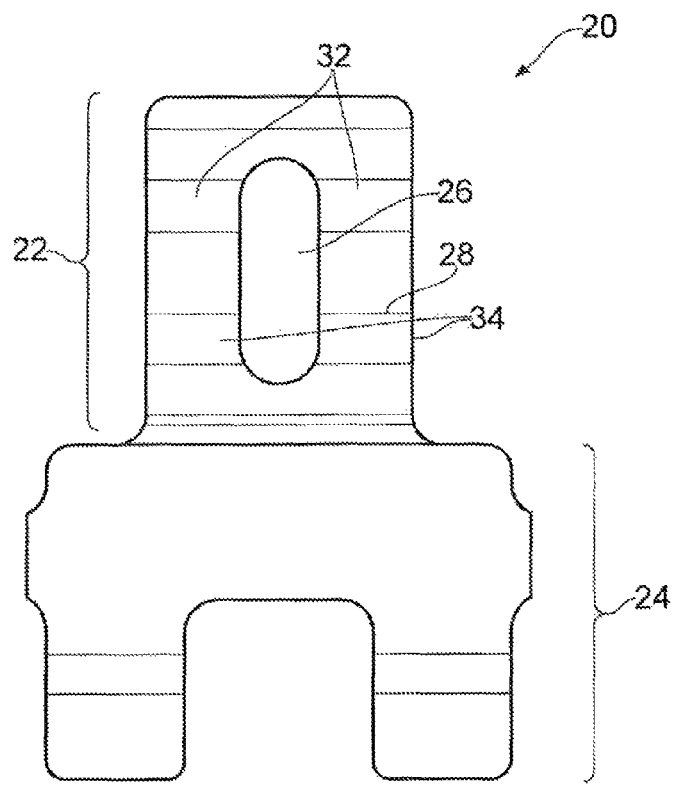
FIG. 2a illustrates a plan view of a connection lead according to an embodiment.
Figure 2B:
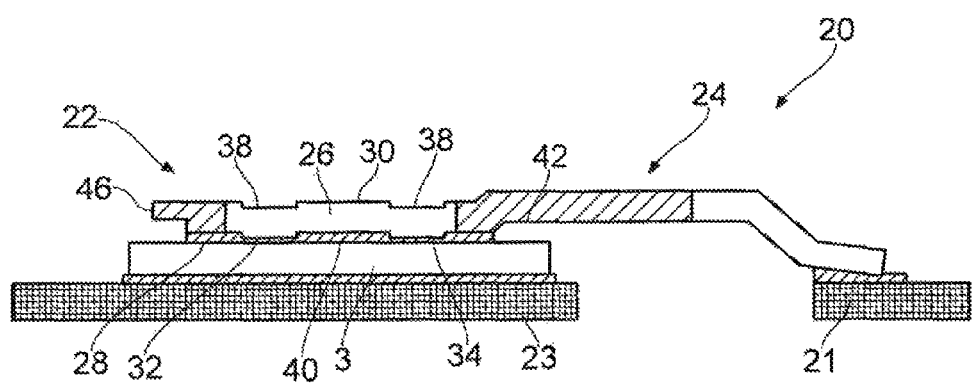
FIG. 2b illustrates cross-sectional view of a connection lead according to an embodiment.
Figure 2C:
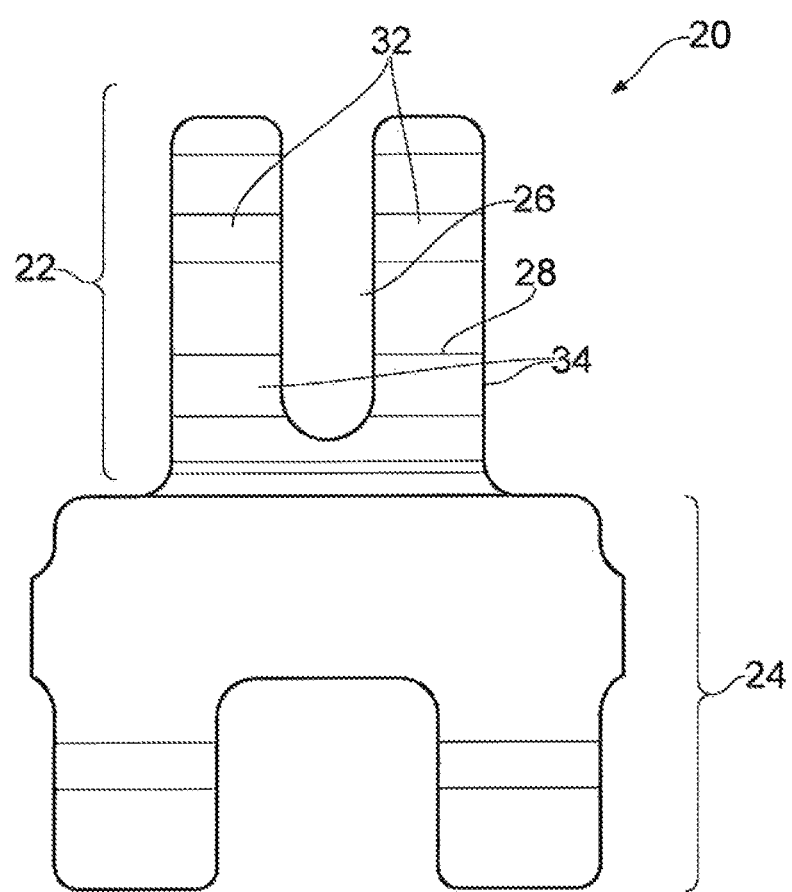
FIG. 2c illustrates a plan view of a connection lead according to an alternative embodiment.

As an alternative to the above arrangement of having a through hole 26 in the clip portion, the clip portion 22 may take a bifurcated form. The clip portion 22 bifurcates extending away from the leadframe connection clip 24 as illustrated in FIG. 2c. In this arrangement the clip portion 22 may be formed of two branches, having a cut away portion between the two branches. This may allow for increased venting of gasses produced in the reflow process, improved access for visual inspection and may also reduce the forces acting on the solder layer since the cross-section area of the clip portion 22 is reduced. This arrangement may result in increased flexibility of the clip portion 26. Increased flexibility may result in improved mechanical performance whereby clip portion may expand and contract during temperature cycling. Alternatively, and as the skilled person will appreciate the clip potion 22 may be formed of three or more branches, having cut away portions between each branch.

The through hole 26 or cut away portions may also allow for simple visual inspection from above of the solder connection between the clip portion 22 and contact portion (not illustrated) on the semiconductor device die 3.

The first major 28 surface may comprise a plurality of protrusions 32, 34 which extend in a first dimension outwardly from the first major surface 28 in a direction towards a contact portion of the semiconductor device die 3. In a second dimension the protrusions 32, 34 may extend ridge like across the first major surface 28. In this regard the protrusion 32, 34 may extend parallel to one another with the through hole there 26 between. Alternatively the through hole 26 or the cut away portion may intersect one or both of the protrusions 32, 34. In an alternative arrangement the protrusions may be arranged so that they notionally intersect each other at a point on the clip portion 22. The intersection point is notional since it may be interrupted by the through hole 26 or cut away portion.

The effect of the protrusions 32, 34 may be to reduce the distance between the contact portion of the semiconductor device die 3 and the clip portion 22. As a result the semiconductor device die 3 may be self-aligned by interaction of the molten solder with the protrusions 32, 34. By way of example only, the distance between the contact portion of the semiconductor device die 3 and the protrusions may be less than 1 µm. The alignment of the semiconductor device die 3 with the clip portion may be due to surface tension forces of the molten solder. This alignment mechanism may avoid misalignment of the semiconductor device die 3 with respect to the clip portion 22. For example, for semiconductor device dies 3 used in low package height arrangements this may prevent short circuits occurring by ensuring that solder does not spill onto areas of the semiconductor device die 3 outside the contact portion. Furthermore, the semiconductor device die 3 may align with the protrusions 32, 34 and as such may not be tilted with respect to the clip, for example touching the clip portion 22 with the semiconductor device die 3 corner.

In addition the effect of the protrusions 32, 34 is to limit areas on the solder connection which have low thickness (typically 10 um or less) solder layer 40 required to make the electrical and mechanical contact from the contact portion of the semiconductor device die 3. In addition when the formation of the protrusions 32, 34 are ridge like and parallel, a channel 38 may be formed across the first major surface 28 of the clip portion 22 which may facilitate the escape of gasses during soldering processes. Under the clip and between the first major surface 28 where there are no protrusions the thickness of solder layer 40 may typically in the order of 30 um to 50 um To reduce delamination of mould compound (not illustrated) used in the final packaged semiconductor device a notch 42 may be provided in the leadframe connection clip 24 of the lead 20. Additionally, the clip portion 22 may include an overhanging portion 46, which may be arranged in a step wise formation at the end of the clip portion 22 distal from the leadframe connection clip 24. This overhanging portion 46 may prevent cracks forming in the mould compound.

Figures 3A, 3B:
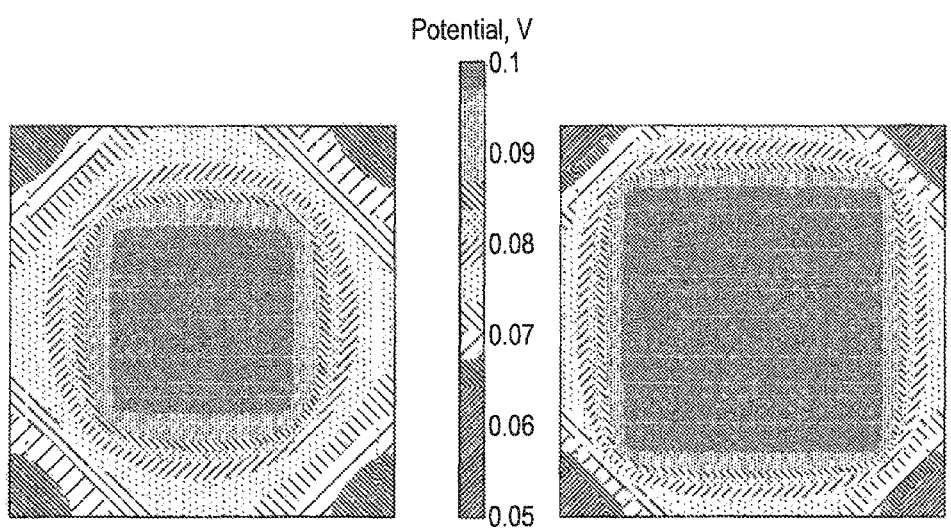
FIG. 3a illustrates a simulation of device on resistance using a known lead.
FIG. 3b illustrates a simulation of device on resistance using a lead in accordance with embodiments.
Figure 4A:
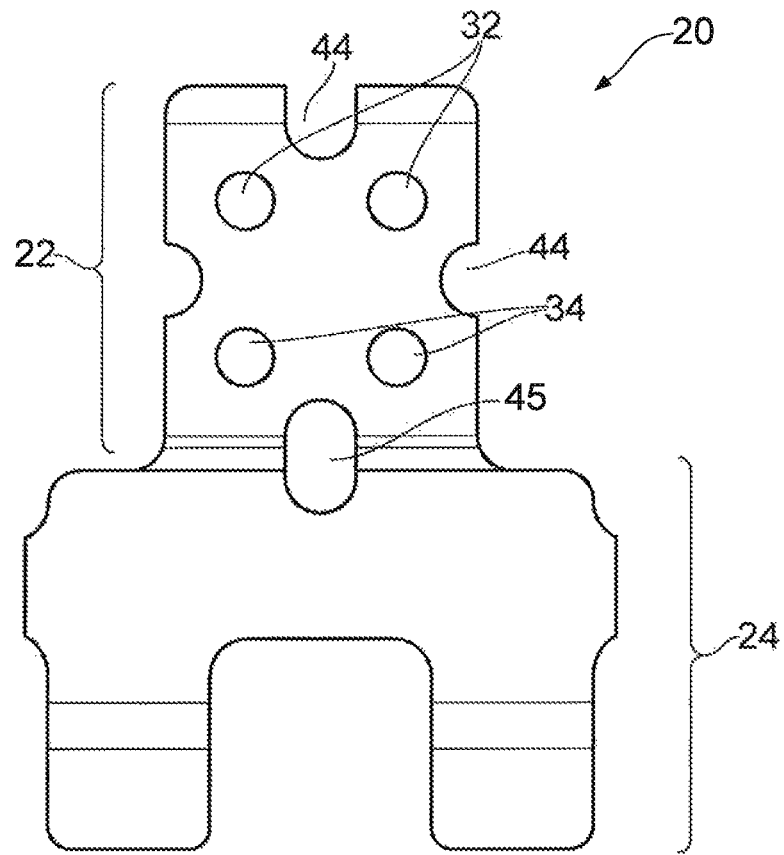
FIG. 4a illustrates a plan view of a connection lead according to an embodiment.
Figure 4B:
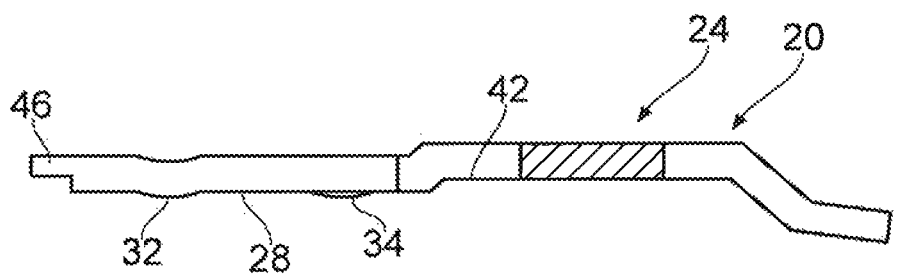
FIG. 4b illustrates cross-sectional view of a connection lead according to an embodiment.

The area of the clip portion 22 should be large enough, such that a low electrical resistance between clip portion and die surface including the corners of the die is achieved. The area of the clip should be such that the contact portion of the die is covered by the clip portion by at least 40% in area. The upper limit of the clip size in relation to the contact pad size may be in the order of 90%. This may minimize the possibility of shorting the semiconductor device die 3 and to allow mechanically and/or electrically secure connection and further allow for inspection of the solder bond. In FIG. 3b, a device simulation (for a device forward current of 19.8 Amps and a forward voltage of 0.44 Volts, and a semiconductor device die 3 contact metal stack thickness of 1.6 µm) illustrates the on resistance between the die and clip results in an approximately 15 mV voltage drop from the centre of the clip attached to the die to the corners of the clip attached as to the die. Compared to FIG. 3a, which shows a simulation for a prior art device, the on resistance simulation for a device comprising embodiments disclosed herein shows a reduction in voltage drop from 35 mV to 15 mV.

The leadframe connection clip 24 may have a bifurcated formation as illustrated. Alternatively, it may be undivided. The bifurcated design may be implemented for situations where it may be required to have separate connection leads bonded thereto.

The clip portion 22 and the leadframe connection clip 24 of the lead 20 are integrally formed from the same piece of material. The material may be any appropriate material so as to allow electrical and mechanical connection via an appropriate solder to the semiconductor die. The material may be for example copper, with silver or tin plating applied thereto. The material may have a degree of flexibility so that it may be resiliently biased against the contact portion of the semiconductor device die 3.

The lead 20 may be formed of by any appropriate process, such as stamping. The protrusions 32, 34 may be formed of any appropriate process as understood by the skilled person, for example so-called stamping or coining techniques. In the case of stamping or coining of the ridges 32, 34, indents 38 may occur on the second major surface 30 of the clip portion 22.

Referring now to Figures renumber 4a and 4b the protrusions 32, 34 may be in the form of dimples which extend in a first dimension outwardly from the first major surface in a direction towards contact portions of the semiconductor device die. The dimples may be any suitable shape provided that they allow for contacting via a solder layer 40 to the contact portion (not illustrated) of the semiconductor device die 3.

One or more cut away portions 44 may be provided around the periphery clip portion 22. By including at least one cut away portion 44 the flexibility of the clip portion 22 may be increased which may prevent cracking of the solder layer during thermal cycling in the reflow process. The cut away portions may also allow gasses to escape (or vent) during the reflow process. The cut away portions may also allow for ease of solder dispensing prior to the reflow process. As with the arrangements above a through hole may be included to further increase venting of gases and allow for inspection. An additional through hole 45 may be provided in the clip portion 22 and the leadframe connection clip 24 which may further allow a visual inspection of the solder layer, by detecting the presence of unwanted material under the leadframe connection clip 24.

The lead may be used in components where large current variations may occur. The lead may also be used in components where parasitic inductances should be limited, for example transient voltage suppression diodes, electrostatic discharge protection diodes or in switch mode power supplies.

By preventing or minimising voids in the solder layer, and by creating a homogeneous and sufficiently thick solder layer due to the protrusions 32, 34, cracks in the solder layer which may be induced during operation of the device by thermal cycling may be reduced. This may improve the strength of the solder bond to form a clip portion 22 of a lead to semiconductor device die. For example the shear force required to break the solder bond will be increased and more specifically the shear force required to break the bond may be increased even after several thousand thermal cycles.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigate against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A lead for connection to a semiconductor device die, the lead comprising:
a clip portion, said clip portion comprising a major surface having two or more protrusions extending therefrom for connection to a bond pad of the semiconductor device die and at least one through hole extending through said clip portion; and
a solder layer between the clip portion and the bond pad, and wherein the through hole or a cut away portion is arranged to provide ventilation sufficient to prevent gases generated by reflow of the solder layer from becoming trapped underneath the major surface of the clip portion.

2. The lead of claim 1, wherein said protrusions are formed as elongate ridges extending in parallel across the major surface of the clip portion.

3. The lead of claim 1, wherein the at least one through hole intersects multiple of the elongate ridges.

4. The lead of claim 3, wherein the hole extends through a plurality of the ridges.

5. The lead of claim 1, wherein the at least one through hole is arranged between said protrusions.

6. The lead of claim 1, wherein the clip portion is bifurcated so at to comprise at least two branches and having a cut away portions there between, wherein each branch of the clip portion comprises at least one protrusion.

7. The lead of claim 1, further comprising one or more cut away portions disposed at the periphery of the clip portion.

8. The lead of claim 1, wherein the clip portion is arranged to be flexible.

9. The lead of claim 1, wherein at least 40% of the area of the clip portion overlaps a contact the area of the semiconductor device die.

10. The lead of claim 1, further comprising a lead frame connection clip, wherein said lead frame connection clip is distal to said clip portion.

11. The lead of claim 10 further comprising a stepwise formation in an end of the clip portion distal to said lead frame connection clip.

12. The lead of claim 10 further comprising a through hole in said frame connection clip and said clip portion.

13. A semiconductor component comprising the lead of claim 1.

14. The semiconductor component of claim 13, wherein the semiconductor component is a power rectifier device or a transient voltage suppression device.

15. The lead of claim 1, wherein the at least one hole is configured and arranged to allow solder points to be visually inspected from above.

16. The lead of claim 1, wherein the clip portion further includes one or more cut away portions.

17. The lead of claim 1, wherein no more than 90% of the area of the clip portion overlaps a contact area of the semiconductor device die.

* * * * *